United States Patent
Frank et al.

(10) Patent No.: US 8,166,286 B2
(45) Date of Patent: Apr. 24, 2012

(54) DATA PIPELINE WITH LARGE TUNING RANGE OF CLOCK SIGNALS

(75) Inventors: Ingolf Frank, Freising (DE); Gerd Rombach, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 712 days.

(21) Appl. No.: 12/137,379

(22) Filed: Jun. 11, 2008

(65) Prior Publication Data
US 2008/0313485 A1 Dec. 18, 2008

Related U.S. Application Data

(60) Provisional application No. 61/016,698, filed on Dec. 26, 2007.

(30) Foreign Application Priority Data

Jun. 12, 2007 (DE) .......................... 10 2007 027 068

(51) Int. Cl.
*H03K 3/356* (2006.01)
(52) U.S. Cl. ................ 713/1; 713/2; 327/199; 327/201; 327/202; 327/214
(58) Field of Classification Search .................. 713/1, 2; 327/199, 201, 202, 214
See application file for complete search history.

(56) References Cited

U.S. PATENT DOCUMENTS

| | | | |
|---|---|---|---|
| 5,497,114 A | 3/1996 | Shimozono et al. | |
| 5,764,089 A | 6/1998 | Partovi et al. | |
| 5,917,355 A | 6/1999 | Klass | |
| 7,256,633 B1 * | 8/2007 | Rafiq | 327/202 |
| 7,719,319 B2 * | 5/2010 | Sumita | 326/105 |
| 7,724,058 B2 * | 5/2010 | Saint-Laurent et al. | 327/291 |
| 7,746,137 B2 * | 6/2010 | Saint-Laurent et al. | 327/200 |
| 7,772,889 B2 * | 8/2010 | Naffziger | 326/93 |

FOREIGN PATENT DOCUMENTS

EP  1542364  6/2005

OTHER PUBLICATIONS

Notification of Transmittal of the International Search Report and the Written Opinion of the International Searching Authority, or the Declaration, date of mailing Oct. 7, 2008, International Application No. PCT/EP2008/057366, International Filing Date Jun. 12, 2008.

* cited by examiner

*Primary Examiner* — M Elamin
(74) *Attorney, Agent, or Firm* — John J. Patti; Wade J. Brady, III; Frederick J. Telecky, Jr.

(57) ABSTRACT

The invention relates to a data pipeline comprising a first stage with a data input for receiving a digital data input signal, a clock input and a data output, and a first bi-stable element being adapted to be switched in response to an edge of a first clock signal, and a dynamic latch stage comprising an input transfer element, and a second bi-stable element coupled between the input transfer element and a dynamic latch data output, wherein the input transfer element is adapted to be switched by a second clock signal and a delayed second clock signal, which is delayed with respect to the second clock signal by a first period of time being shorter than half a period of the second clock signal, such that the input transfer element allows signal transfer only during the first period of time.

14 Claims, 10 Drawing Sheets

DATA PIPELINE WITH LARGE TUNING RANGE OF CLOCK SIGNALS

This patent application claims priority from German Patent Application No. 10 2007 027 068.4, filed 12 Jun. 2007, and U.S. Provisional Patent Application No. 61/016,698, filed 26 Dec. 2007, the entireties of which are incorporated herein by reference.

FIELD OF THE INVENTION

The invention relates to a data pipeline and a method of storing single bit data in a data pipeline.

BACKGROUND

Many up-to-date data processing systems require data to be buffered while transferring the data between master and slave devices, such as central processing units (CPU) and memories. Data buffering can be performed by a data pipeline where data is stored in a first register with a first clock signal. From the first register the data is transferred to a second register by a second clock signal. The relationship between the two clock signals, in particular the clock phases, underlie certain restrictions. The second clock phase must be in a certain time frame with regard to the phase of the first clock signal. For a fast data transfer more restrictions are to be taken into account. Many applications require that the timing of the first register (pre-register timing) is decoupled from the timing of the second register (post-register timing). The pre-register timing can be in a noisy environment while the post-register side requires a noise-free signal. A buffer circuit for DDR3 applications is a typical example of such an application. Typically, a two flip-flop or a flip-flop and latch pipeline is used in conventional data pipeline architectures. The respective circuits are shown in FIGS. 1(a) and (b). Usually, the first clock CLK1 and the second clock CLK2 are in phase and the input data of the first flip-flop FF1 appears only after a specific edge of the second clock signal CLK2 at the output of the second flip-flop FF2. The propagation delay time of the signals is 1 clock period plus the propagation delay time (TPD) from CLK2 to the output Q2 of the second flip-flop. In order to speed up the system, the phase of the second clock CLK2 might be shifted closer to the phase of the first clock CLK1. However, the limit is the propagation delay time of the first flip-flop FF1 and set-up time of the second flip-flop FF2. Carefully designed in today's high-speed technologies, the delay can range from 300 up to 600 ps. This corresponds to approximately four gate delays in the respective technology. The overall propagation delay can be reduced by 200 ps, if the second flip-flop is replaced by a latch as shown in FIG. 1 (b). A low to high transition of the second clock CLK2 switches the latch into the transparent mode. The latch is in transparent mode before the data arrives at Q1, the data will be triggered by the first clock signal CLK1. If the latch is turned into transparent mode after the data arrives at Q1, the data transfer from the flip-flop to the latch is basically triggered by the second clock signal CLK2. In the first case, the flip-flop and latch timing is not decoupled but delivers the fastest data transfer rate. In order to decouple the pre-and post-register timing, the latch has to be switched in non-transparent mode before a new data arrives at Q1. This can be achieved by shifting the phase of the second clock signal CLK2 to less than 180 degrees of the clock period dependent on the duty cycle and the whole time of the latch. However, this limits the tuning range of the second clock phase.

SUMMARY

It is an object of the invention to provide a data pipeline architecture for a high data throughput and decoupled pre- and post-register timing.

In one aspect, the invention provides a data pipeline which has a first stage with a data input for receiving a digital data input signal, a clock input, a data output and a first bi-stable element being adapted to be switched between one of two states in response to a an edge of a first clock signal. A described embodiment further has a dynamic latch stage with an input transfer element, and with a second bi-stable element coupled between the input transfer element and a latch data output. The input transfer element is coupled to a second clock signal and a delayed second clock signal, which is delayed by a first period of time being shorter than half a period of the second clock signal. The input transfer element is adapted to allow signal transfer only during the first period of time.

Compared to prior art data pipelines having a flip-flop and a latch or two flip-flops, the described embodiment allows the tuning range to be increased substantially by using a flip-flop and a dynamic latch. The dynamic latch is configured to enter the transparent mode only for a very limited period of time (i.e., during the first period of time). Accordingly, the phase of the second clock signal can be shifted in a wide range irrespective of an additional variation of the output signal of the first stage.

According to another embodiment of the invention, the second bi-stable element includes two cross-coupled inverters, the output of one inverter being coupled to the input of the respective other inverter through at least one feedback transfer element, wherein the feedback transfer element is adapted to transfer the output signal of one inverter to the input of the other inverter except during the first period of time. This arrangement prevents any changes of the state of the second bi-stable element, and thereby of the latch output, except during the first period of time. Clocking the bi-stable element according to this aspect of the invention in combination with the clocking scheme of the input transfer element assures that the state of the dynamic latch stage can only change during the first period of time.

Further, the dynamic latch stage includes a delay element for delaying the second clock signal for the first period of time to produce a delayed second clock signal. The length of the first period of time is defined by the delay of the delay element. The delay element may be implemented by a chain of logic gates, as for example a plurality of cascaded inverters or other logic gates. This aspect of the invention allows short periods of time to be implemented, which are substantially shorter than half a clock period of the second clock. The input transfer element is adapted to be driven by the second clock signal and the delayed second clock signal such that the input transfer element only transfers data in the period of time between a specific edge of the second clock signal and a corresponding edge of the delayed and inverted version of the second clock signal. Therefore, the input transfer element may be implemented by a transfer gate or by an inverter with an input for the second clock signal and the delayed second clock signal to be switched on and off by respective edges of the two clock signals. As long as the input transfer element is switched off, no data (or signals) can be transferred from the transfer element's input to its output, which prevents the state of the bi-stable element coupled to the output from being changed.

According to a described embodiment, the first stage may be a flip-flop. However, the first stage can also be implemented as a dynamic latch. If the first stage is a dynamic latch, it has an input transfer r element, and a first bi-stable element coupled between the input transfer element and a latch data output. The input transfer element is coupled to the first clock signal and a delayed first clock signal, which is delayed by a second period of time being shorter than half a period of the first clock signal, wherein the dynamic transfer element is adapted to allow signal transfer only during the second period of time. According to this aspect of the invention, the tuning range and the decoupling of the first stage and the second stage is further improved. The first bi-stable element can include two cross-coupled inverters, the output of one inverter being coupled to the input of the respective other inverter through at least one feedback transfer element. The feedback transfer element is adapted to prevent signal transfer during the second period of time. Further, the first stage may include a delay element for delaying the first clock signal for the second period of time.

The transfer element of the dynamic latch stages may also be coupled and driven by an additional third clock signal. The third clock signal is used instead of the delayed first or second clock signal, respectively. It has the same frequency as the first or second clock signal, but the respective first or second periods of time during which the transfer element is open (allows transfer) are defined by edges of the first or second clock signal and the third clock signal. The third clock signal is chosen such that the duration of the first and second periods of time are preferably smaller than half a period of the first and second clock signals. The input transfer element can be implemented as a clocked CMOS inverter. The feedback transfer element is preferably a passive CMOS transfer gate.

In another aspect, the invention also provides a method of storing single bit data in a data pipeline. In a described embodiment, the method includes storing a single bit data in a first stage in response to an edge of a first clock so as to provide the single bit data at an output of the first stage, transferring the single bit data from the output of the first stage to a second stage wherein the state of the second stage is only variable during a first period of time, which is shorter than half a period of a second clock and starts with an edge of the second clock signal. The first period of time is preferably defined by delaying and inverting the second clock signal to provide the first period between the edge of the second clock signal and a corresponding edge of the delayed and inverted second clock signal.

The described pipeline architecture and the method embodiments according to the invention allow a fast data transfer from one clock domain into a second decoupled clock domain. The wide tuning range of the clocks provides a reliable data transfer as the pipeline registers are fail-safe in terms of a displacement of the second clock. If the second clock is shifted too close to the first clock domain, the data will be transferred correctly but triggered by the first clock. Compared to conventional solutions, the propagation delay time savings can amount up to 300 to 600 ps.

BRIEF DESCRIPTION OF THE DRAWINGS

Further details of the invention will become apparent from the following detailed description of example embodiments, with reference to accompanying drawings, wherein.

DETAILED DESCRIPTION OF EXAMPLE EMBODIMENTS

Figure 1A:
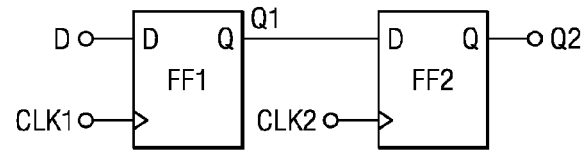
FIGS. 1A and 1B show two data pipeline structures according to the prior art.
Figure 1B:
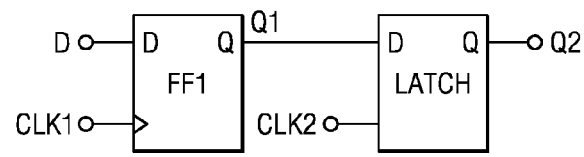

FIG. 1A shows the basic two flip-flop data pipeline structure. The first clock signal CLK1 is used to clock the data at data input D to the output of the first flip-flop FF1. A second clock signal CLK2 is used to store the data in the second flip-flop FF2. If both flip-flops FF1 and FF2 operate in response to a rising edge of the input clock, the input data D appears at the output Q2 after a rising edge of the first clock CLK1 and the second clock CLK2 and after the respective propagation delay times and set up times. FIG. 1B shows a flip-flop latch configuration according to the prior art. The basic difference with respect to FIG. 1A is in the use of a latch instead of a flip-flop for the second register.

Figure 2:
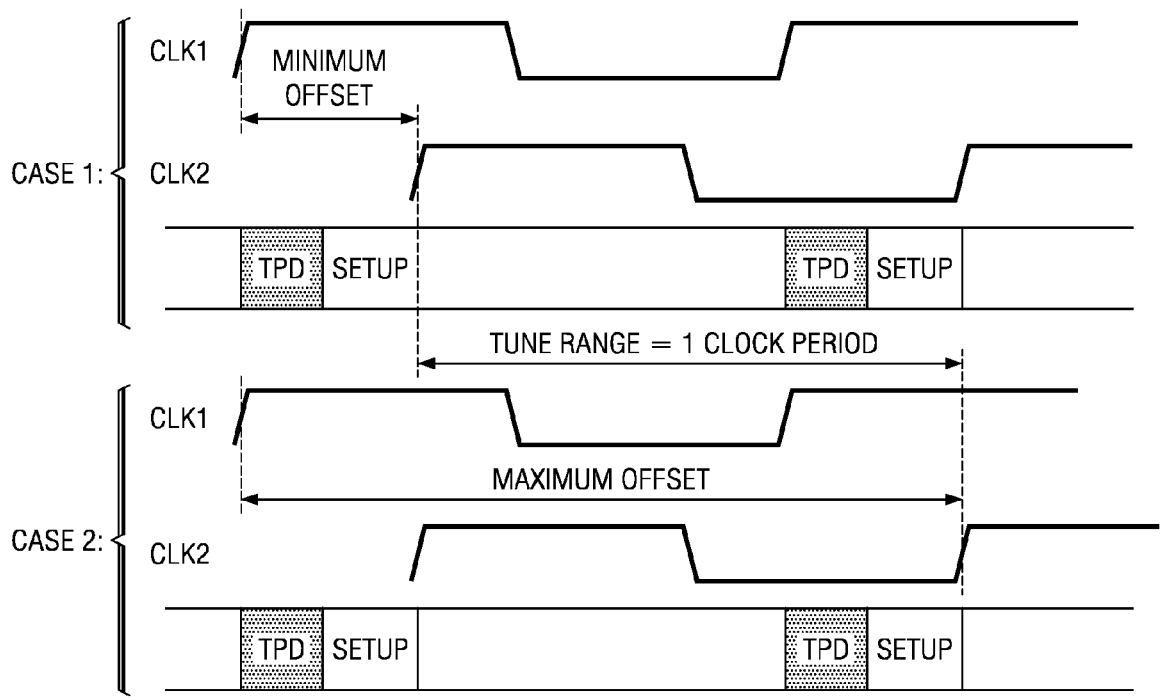
FIG. 2 shows the basic building blocks of flip-flops according to the prior art.

FIG. 2 shows waveforms illustrating the timing of a two flip-flop pipeline architecture according to the prior art. Two cases referred to as case 1 and case 2 are illustrated. Case 1 relates to the minimum offset or phase shift required between a rising edge of the first clock CLK1 and the second clock CLK2. The second case relates to the maximum offset or the maximum phase shift, which can be applied to the second clock signal with respect to the first clock signal CLK1. The maximum tuning range is the difference between the minimum offset and the maximum offset. The second clock signal CLK2 must be delayed by the propagation delay time (TPD) of the first flip-flop (FF1) shown in FIG. 1A and the set-up time (indicated by the term set-up) of the second flip-flop (FF2 in FIG. 1A). The combined delay of TPD and set-up can be in a range of 300 to 600 ps for an up-to-date high-speed technology. This minimum delay can be a problem for up-to-date high-speed applications. The maximum tuning range of the second clock signal CLK2 is one clock period. However, the clock jitter of the first and the second clock signals CLK1 and CLK2 reduces the tuning range.

Figure 3:
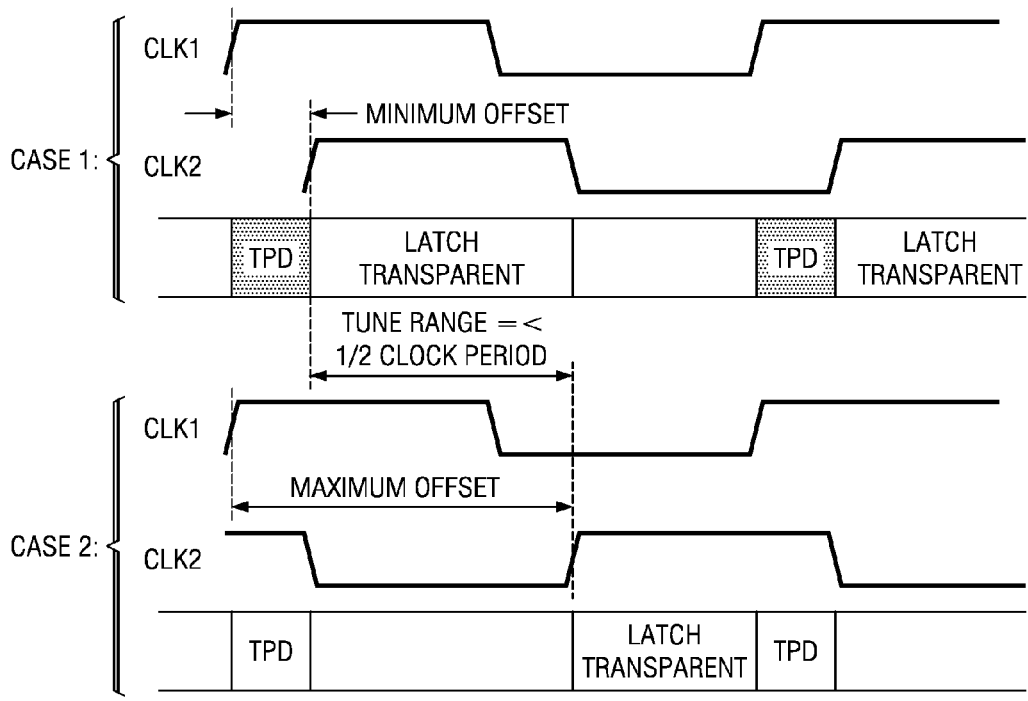
FIG. 3 shows timing diagrams relating to a conventional flip-flop data pipeline.

FIG. 3 shows waveforms in order to illustrate the timing requirements for a flip-flop-latch data pipeline architecture according to the prior art. Accordingly, the second clock signal CLK2 must be delayed by the propagation delay time TPD of the first flip-flop (FF1 shown in FIG. 1B). The set-up time of the latch can be ignored as the latch enters into the transparent mode of the rising edge of the second clock signal CLK2. The delay resulting from the propagation delay time can be in a range of 200 to 400 ps. Although this constitutes an improvement compared to the two flip-flop structure shown in FIG. 1A, the overall tuning range is reduced to less than half a clock period of the second clock signal and depends on the duty cycle of the second clock signal CLK2. This is due to the fact that the latch should not be transparent while the output of the first flip-flop FF1 changes the state.

Figure 4A:
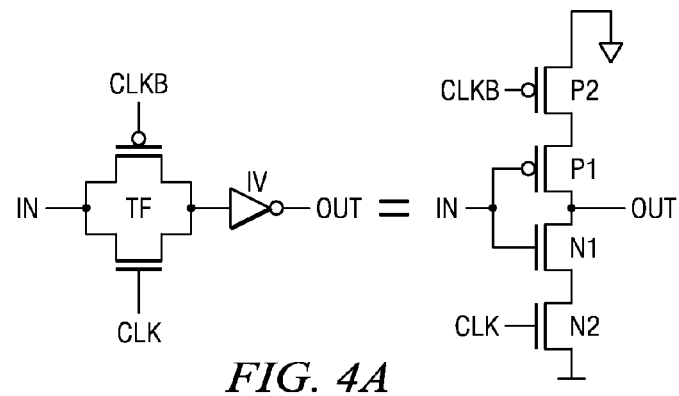
FIGS. 4A-4C show waveforms relating to a flip-flop latch data pipeline according to the prior art.
Figure 4B:
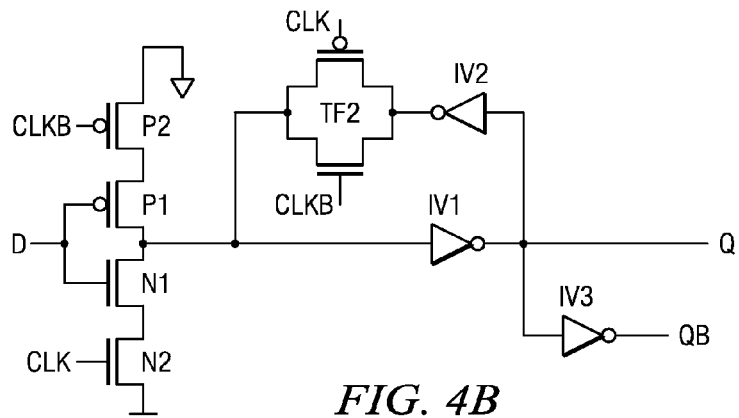
Figure 4C:
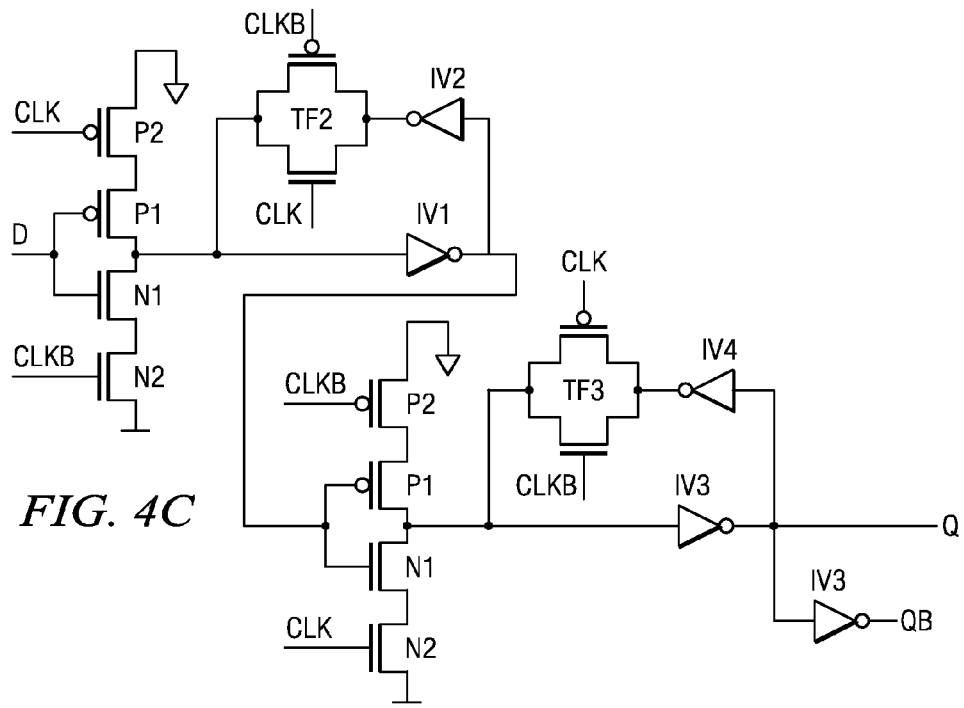

FIGS. 4A-4C show the basic building blocks for latches and flip-flops. FIG. 4A illustrates the equivalence between two different ways to implement a transfer element. On the left hand side there is a transfer gate including an NMOS and a PMOS transistor coupled in parallel to an inverter IV. In response to the clock signals CLK and CLKB an input signal can be transferred from the input IN to the output OUT. The same effect is achieved by a structure shown on the right hand side of FIG. 4A. An inverter consisting basically of an NMOS transistor N1 and a PMOS transistor P1 is used as a transfer element to transfer a signal from the input IN to the output OUT. Further, there are two MOSFET transistors P2 and N2 which are switched in order to enable and disable the transfer element. The input transfer elements according to the invention are preferably implemented as the one shown on the right hand side. The transfer gate on the left hand side, without the inverter IV, is preferably used as feedback transfer element.

FIG. 4B shows a typical conventional latch. The data input D is coupled to a transfer element as the one explained with respect to FIG. 4A. Further, there is a bi-stable element consisting of cross-coupled inverters IV1 and IV2 including a feedback transfer element TF2 being coupled between the output of IV2 and the input of IV1. Further, there is a third inverter IV3 for providing the complementary output QB. As long as the transfer gate TF2 couples the output of IV2 to the input of IV1 the state of the bi-stable element can not be changed. If the clock signal CLK switches from LOW to HIGH the input transfer element couples the data input signal D to the input of IV1. At the same time, the transfer gate TF2 is turned off such that the output of IV2 is decoupled from the input of IV1. Accordingly, the state of the bi-stable element is changed in accordance with the state of the data input signal D. As the input transfer element performs an inversion of the state of the input data D, which is reversed by the inverter IV1, the output signal Q will have the same state as the input data D as long as the clock signal CLK remains in a high state HIGH. Throughout the following description, the situation during which the output signal immediately adopts the state of the input signal is referred to as the "transparent mode". As long as the clock signal CLK is low, the input signal can not propagate to the output. This situation is referred to as the "non-transparent mode".

FIG. 4C shows a master and slave flip-flop according to the prior art. The flip-flop includes a master stage with an input transfer element having transistors N1, N2, P1, P2 and the bi-stable element consisting of inverters IV1 and IV2 and the feedback transfer gate TF2. The slave state includes another input transfer element and the bi-stable element consisting of inverters IV3 and IV4 and the feedback transfer gate TF3. The clock signals supplied to the master stage and the slave stage are inverted with respect to each other. Accordingly, the falling edge of the clock signal CLK allows the first bi-stable element of the master stage to be varied in accordance with the state of the data input signal D. A rising edge of the clock signal CLK allows to transfer the data signal from the output of the master stage to the output Q of the slave stage.

Figure 5A:
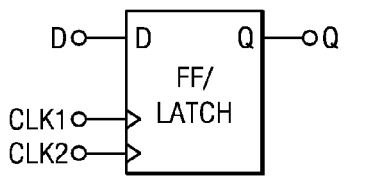
FIGS. 5A and 5B show symbols representing a data pipeline according to the invention.
Figure 5B:
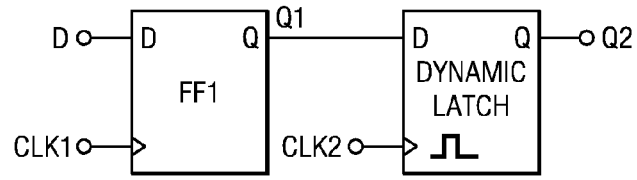

FIG. 5A shows a symbol for a data pipeline architecture according to the invention. Another possible representation similar to FIG. 5A is shown in FIG. 5B. The pipeline architecture according to the invention includes a dynamic latch and a flip-flop or two dynamic latches as will be explained herein below in more detail.

Figure 6:
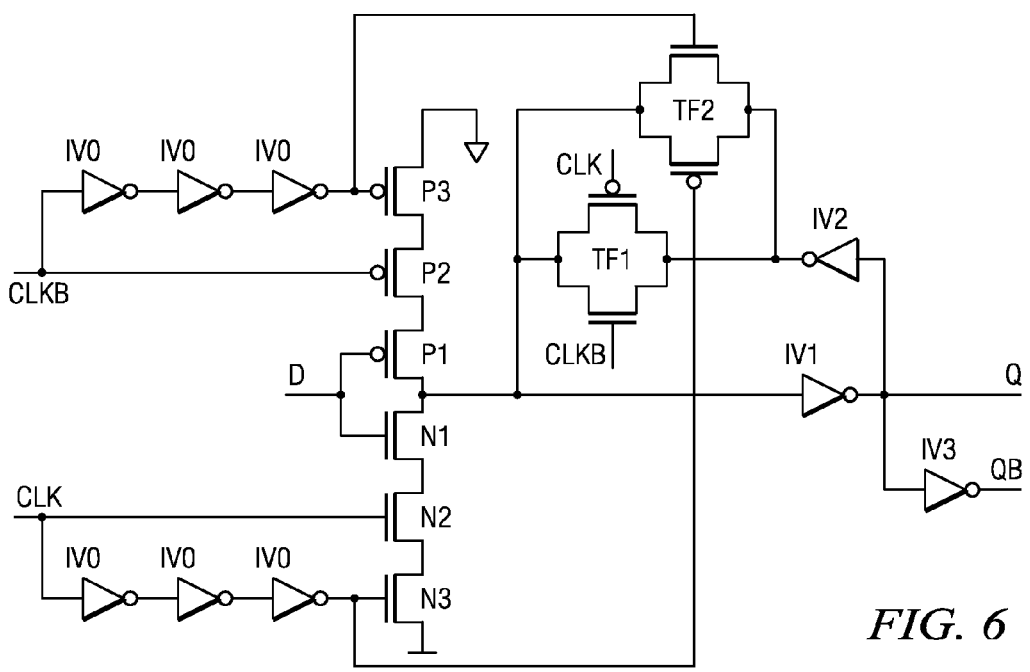
FIG. 6 shows a simplified schematic of a dynamic latch according to the invention.

FIG. 6 shows a simplified schematic of a dynamic latch according to an aspect of the invention. The input transfer element consisting of transistors N1, N2, N3, P1, P2 and P3 is adapted to receive two clock signals CLK and two complementary clock signals CLKB. The clock signal CLK is delayed by three inverters IV0 in a chain in order to generate a specific delay time during which the dynamic latch is in the transparent mode. The same delay element consisting of three inverters IV0 is coupled to the complementary clock signal CLKB. Accordingly, the input transfer element allows signal transfer only during a first period of time defined by the delay of the three inverters. The delayed versions of the clock signal CLK and the inverted clock signal CLKB are also coupled to a feedback transfer gate TF2 which is coupled in parallel to a feedback transfer gate TF1 in the bi-stable element consisting of inverters IV1 and IV2 and the two transfer gates TF1 and TF2. The architecture according to the invention results in a latch, which is in the transparent mode only during the first period of time defined by the delay of the three inverters IV0.

Figure 7:
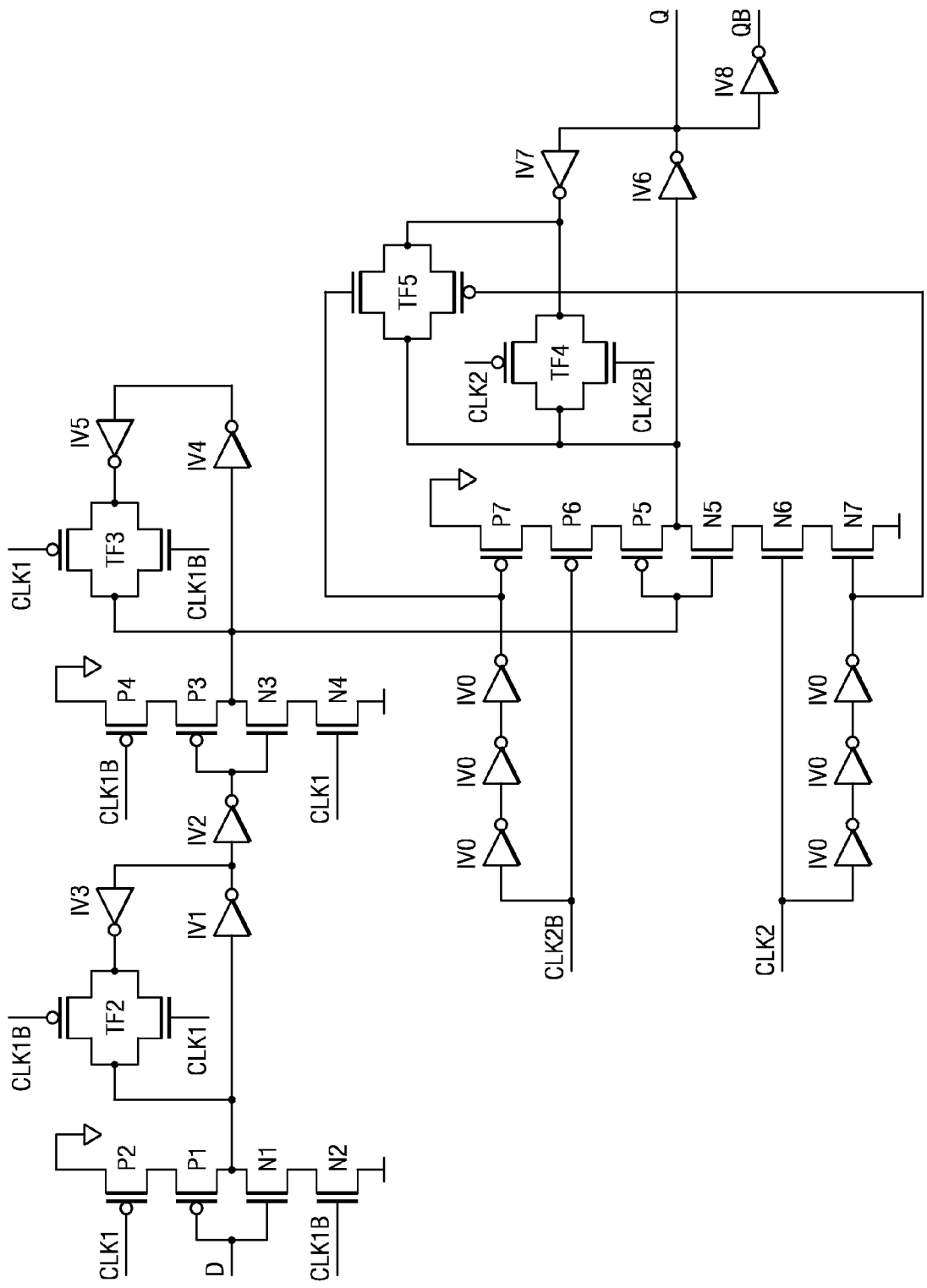
FIG. 7 shows a data pipeline structure according to an aspect of the invention.

FIG. 7 shows a simplified schematic of a data pipeline structure according to a first embodiment of the invention. Accordingly, a conventional master and slave flip-flop is coupled to a dynamic latch as the one shown in FIG. 6. The input transfer elements of the first stage consist of transistors N1, N2, P1, P2 and N3, N4, P3, P4, respectively. The bi-stable elements of the flip-flop consist of IV1 and IV3, as well as IV4 and IV5. Each pair of inverters is cross coupled and connected through a respective feedback transfer element, i.e. transfer gates TF2 and TF3. The second stage has an input transfer element consisting of N5, N6, N7 and P5, P6, P7 and is coupled to the second clock signal CLK2 and the inverted second clock signal CLK2B. The delayed second clock signal CLK2 is coupled to the gate of P7, whereas the delayed inverted second clock CLK2B is coupled to N7. Accordingly, the input transfer gate allows signal transfer (where the transferred signal is actually inverted) only for the short period during which CLK2 is high (i.e. CLK2B is low) and the delayed version of CLK2 is also high (i.e. the delayed version of CLK2B is still low). The propagation delay of the inverters IV0, defines the time during which the input transfer element is open (allows transfer). As the transfer element is an inverter, the input signal will also be inverted. The bi-stable element consisting of IV6 and IV7 includes feedback transfer elements TF4, and TF5. These transfer elements or transfer gates TF4, TF5 are also coupled to the second clock CLK2 and CLK2B (coupled to TF4) and the delayed versions of the second clock CLK2 and CLK2B (coupled to TF5). Accordingly, due to the cross coupling, the state of the bi-stable element can only be changed if the transfer gates interrupt signal transfer, i.e. if the transfer gates TF4, TF5 decouple the inverters IV6 and IV7 from each other. This occurs during the period of time in which the input transfer element allows transfer (i.e. the input transfer element is open). Accordingly, a timing window is provided between a rising edge of CLK2 at the gate of N6 and until the rising edge of CLK2 propagates through the three inverters IV and appears at the gate of N7 (similar for CLK2B and P6 ,P7). Only during this timing window is a change of the state of the second stage (i.e. the dynamic latch stage) possible. So, the tuning range and the decoupling of the first stage and the second stage is improved. The behavior of the circuit shown in FIG. 7 will be explained in more detail by reference to the waveforms shown in FIG. 8.

Figure 8:
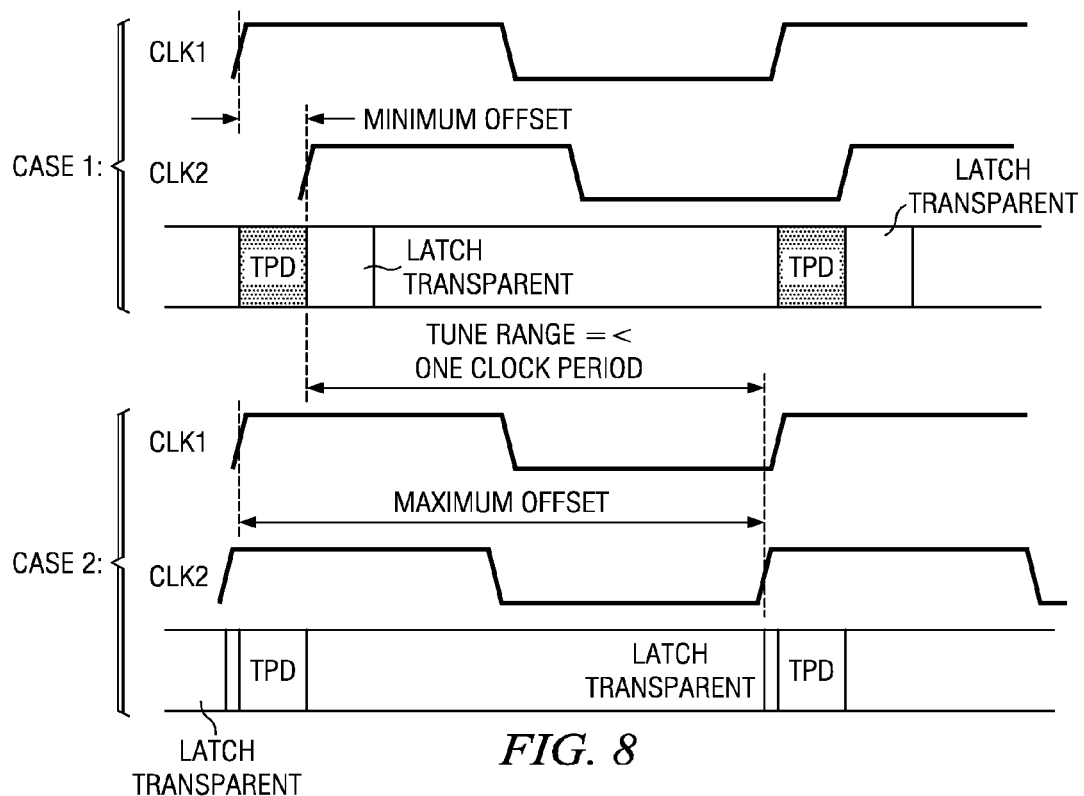
FIG. 8 shows waveforms illustrating the timing of the data pipeline structure shown in FIG. 7.

In FIG. 8, similar to the conventional data pipeline architectures, two cases are distinguished. In case 1 the minimum delay between the rising edge of the first clock CLK1 and the rising edge of the second clock CLK2 is illustrated. Case 2 relates to the maximum offset or the maximum phase shift between the rising edges of the two clock signals. Accordingly, the second clock signal CLK2 has to be delayed by the propagation delay time TPD of the master and slave flip-flop shown in the upper part of FIG. 7. This delay can be in a range of 200 to 400 ps in an up-to-date high-speed technology. The tuning range is little less than one clock period, but substantially improved compared to the flip-flop latch structure shown in FIG. 1B. This is due to the fact that the dynamic latch remains in transparent mode only for a very short period of time, which is substantially defined by the delay elements shown in FIGS. 6 and 7. The dynamic latch increases the tuning range and renders the tuning range basically independent from the duty cycle of the clock signals CLK1 and CLK2.

Figure 9:
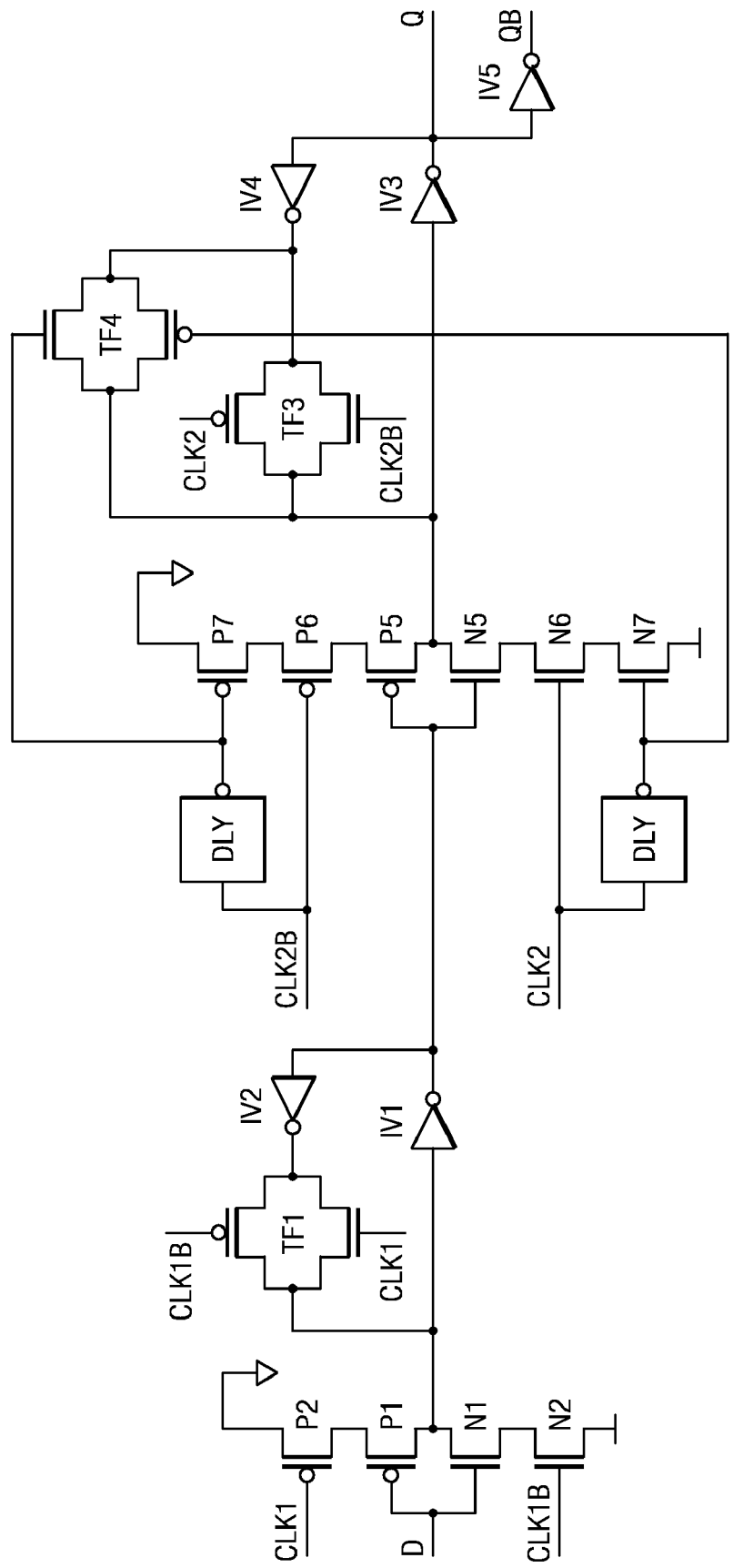
FIG. 9 shows a simplified schematic of a data pipeline architecture according to another aspect of the invention.

FIG. 9 shows a simplified schematic of a data pipeline architecture according to another embodiment of the invention. According to this embodiment of the invention, the master and slave flip-flop is replaced by a simple latch. The output of the latch is coupled to a dynamic latch according to the invention. The chain of inverters shown in FIGS. 6 and 7 is simplified and represented by the delay elements DLY.

Figure 10:
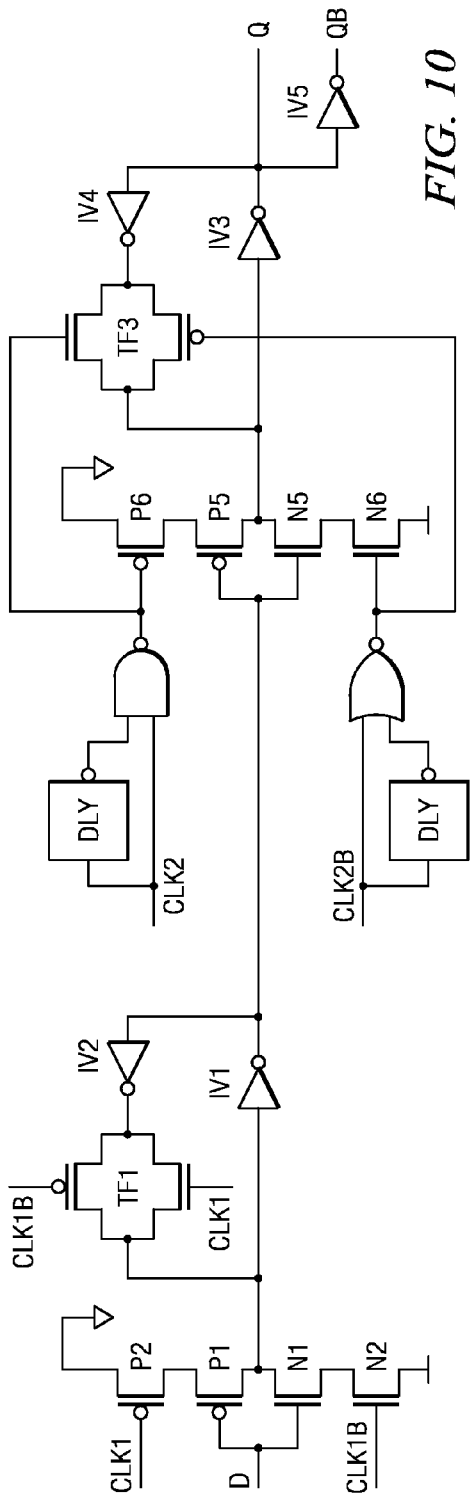
FIG. 10 shows a simplified schematic of a data pipeline structure according to another aspect of the invention.

FIG. 10 shows a simplified schematic of a data pipeline architecture according to still another embodiment of the invention. The circuit shown in FIG. 10 provides the same functionality as the circuit shown in FIG. 9. The input transfer element of the dynamic latch is simplified in that only one PMOS transistor P6 and one NMOS transistor N6 is necessary. Further, the second transfer gate TF4 of FIG. 9 is removed as and an additional NAND gate and an additional NOR gate is introduced.

Figure 11:
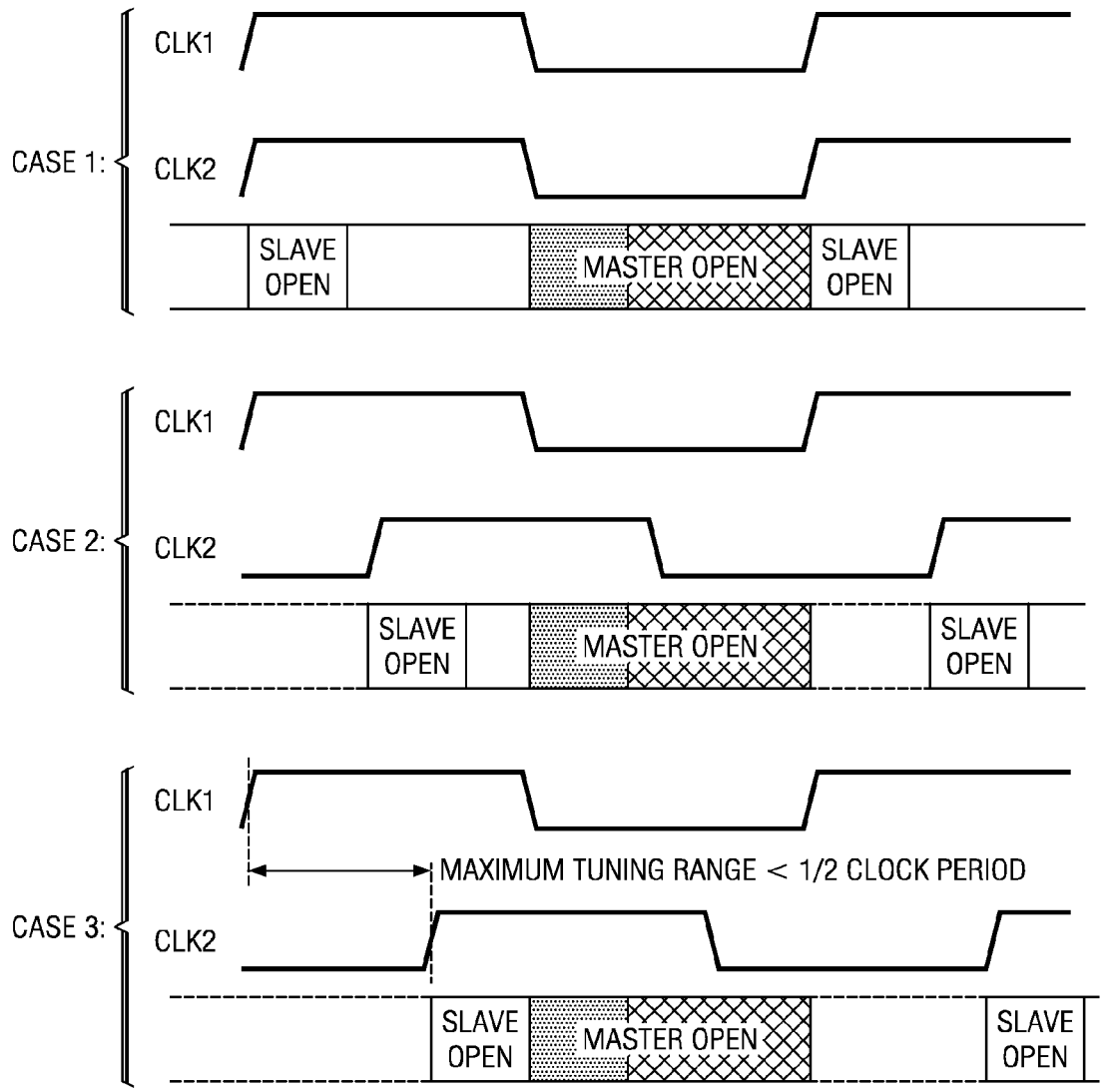
FIG. 11 shows waveforms illustrating the timing of the data pipeline architectures of FIGS. 9 and 10.

FIG. 11 shows waveforms relating to the circuits shown in FIGS. 9 and 10. Case 1 illustrates the minimum phase shift between the rising edge of the first clock signal CLK1 and the second clock signal CLK2. Case 2 relates to a situation where a phase shift is introduced between the first and the second clock signals CLK1 and CLK2. Finally, case 3 illustrates the maximum phase shift between the tow clock signals. Accordingly, the minimum required phase offset between the clock signals CLK1 and CLK2 is zero. The data can be transferred very fast. If the offset time is zero, the jitter values of both clock signals CLK1 and CLK2 will be superposed and sent to the output. A little latency of the second clock signal CLK2, which is smaller than the jitter of the first clock signal CLK1, can cover the jitter of the first clock signal CLK1. A jitter cleaning function can be applied in order to reduce the jitter. The tuning range is reduced by half a clock period of the first clock signal due to the minimum required open time for the flip-flop slave. The tuning range depends on the duty cycle of clock signal CLK1.

Figure 12:
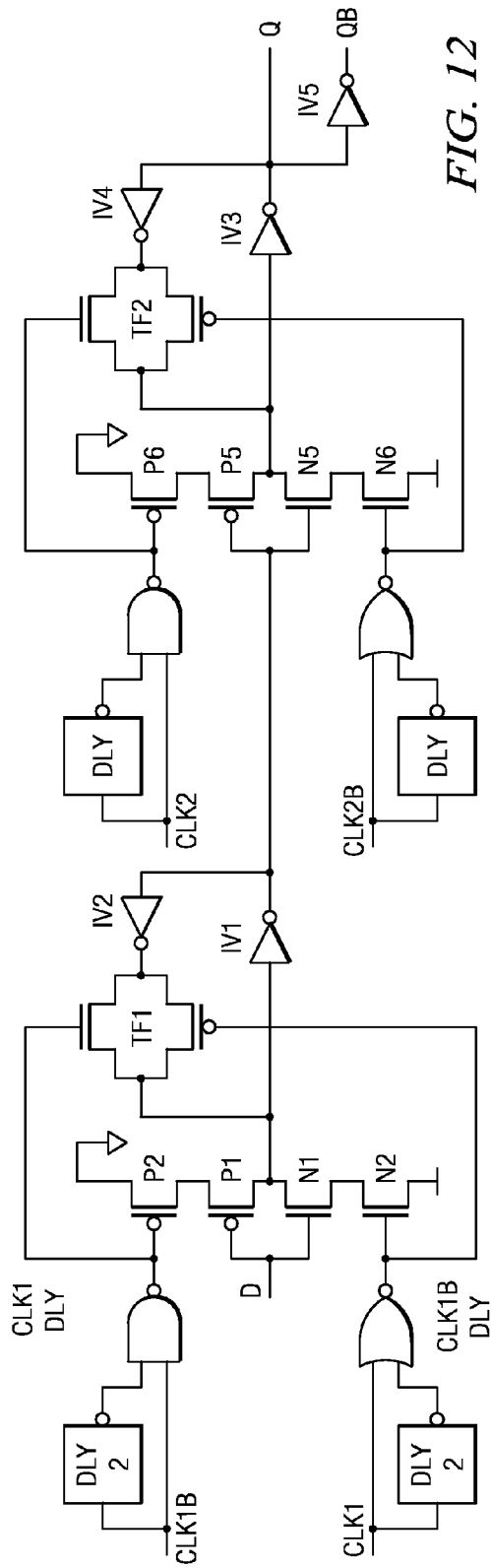
FIG. 12 shows another embodiment of the invention.

FIG. 12 shows a simplified schematic of a data pipeline architecture according to an embodiment of the invention. The data pipeline architecture includes two dynamic latch structures similar to the one shown in FIG. 6. Accordingly, the input latch of FIG. 10 is replaced by a dynamic latch according to the invention.

Figure 13:
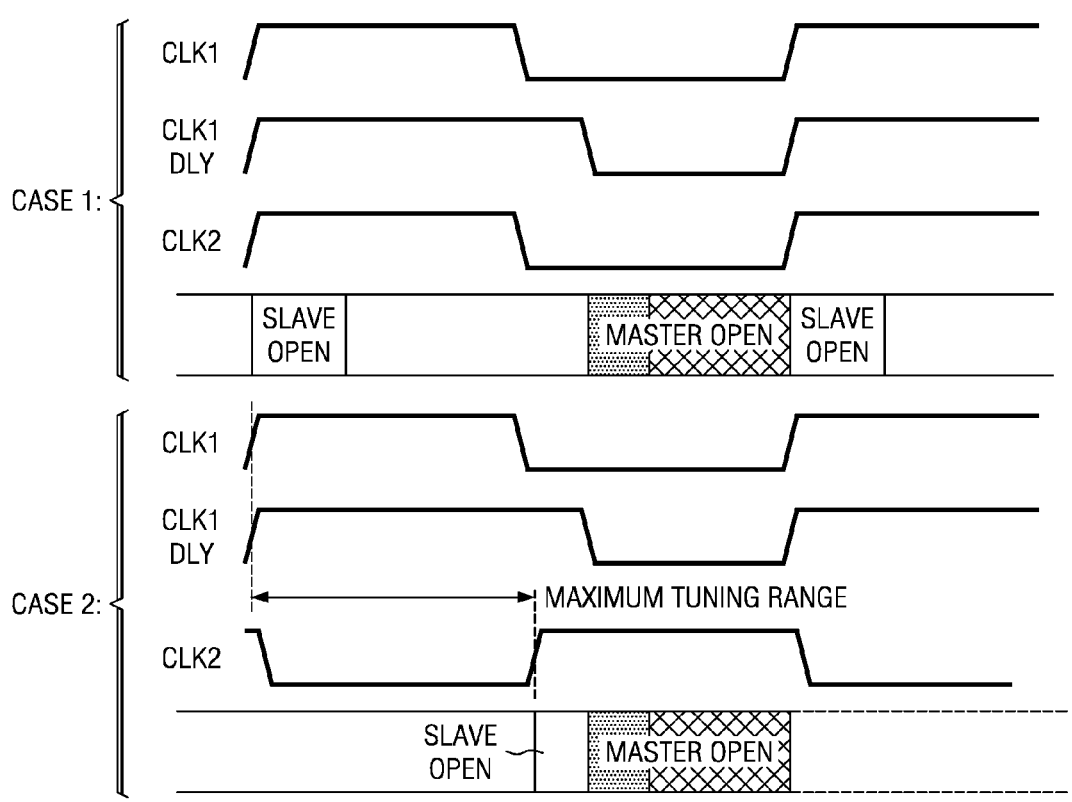
FIG. 13 shows waveforms illustrating the timing of the embodiment shown in FIG. 12.

The timing of the circuit shown in FIG. 12 is illustrated by the waveforms shown in FIG. 13. Accordingly, the open duration (transparent mode) of the master also defines the tuning range of the second clock signal CLK2. The open duration (transparent mode) can be decreased by a dynamic latch structure as the one explained with respect to FIG. 6. The tuning range increases by the same amount as the open duration of the master is reduced.

Figure 14:
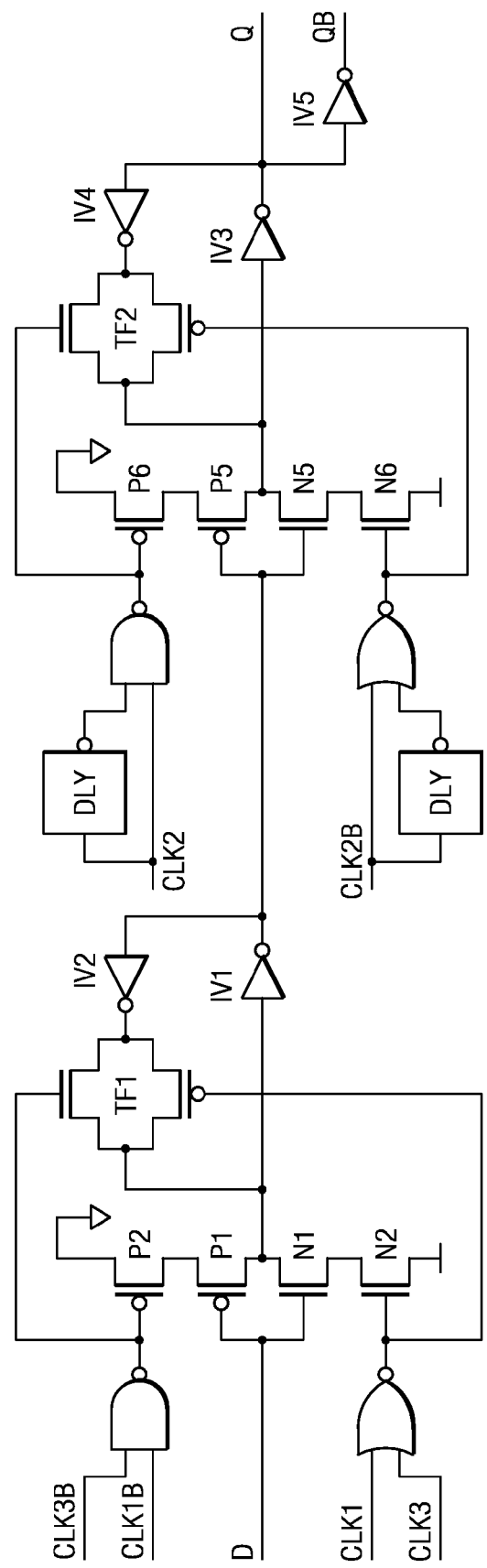
FIG. 14 shows a simplified schematic of an embodiment of the invention.
Figure 15:
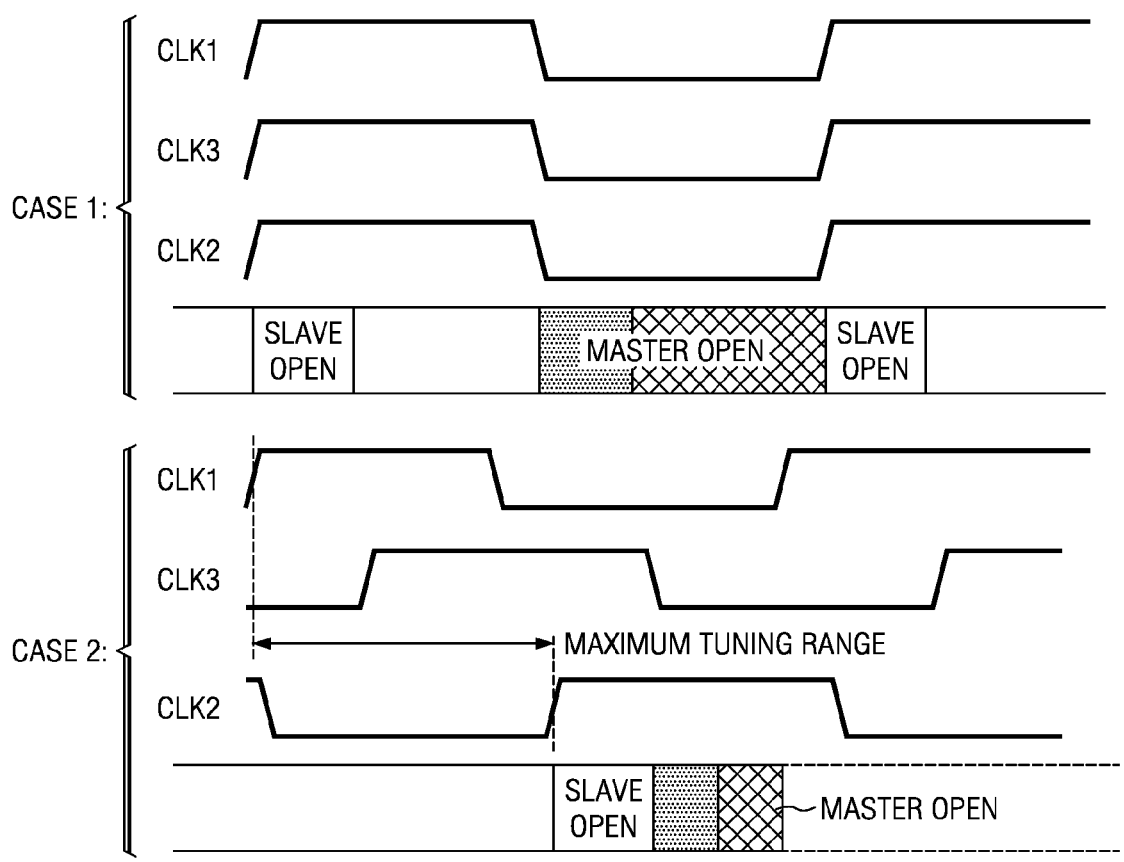
FIG. 15 shows waveforms illustrating the timing of the embodiment shown in FIG. 14.

FIG. 14 shows a simplified schematic of a data pipeline architecture of another embodiment of the invention. Accordingly, a third clock signal CLK3 is introduced to use the period of time during which the input dynamic latch of the pipeline structure is in transparent mode. The timing of the circuit shown in FIG. 14 is illustrated by the waveforms shown in FIG. 15. The open duration of the first dynamic latch is reduced by clock signal CLK3. This clock signal may be derived from a ring voltage controlled oscillator or the like.

Those skilled in the art to which the invention relates will appreciate that there are other and further embodiments and variations within the scope of the claimed invention.

What is claimed is:

1. A data pipeline comprising:
    a first stage having:
        a data input for receiving a digital data input signal;
        a clock input and a data output; and
        a first bi-stable element being adapted to be switched in response to an edge of a first clock signal; and
    a dynamic latch stage having:
        an input transfer element that is adapted to be switched by a second clock signal and a delayed second clock signal, which is delayed with respect to the second clock signal by a first period of time which is shorter than half a period of the second clock signal, such that the input transfer element allows signal transfer during the first period of time; and
        a second bi-stable element coupled between the input transfer element and a dynamic latch data output, wherein the second bi-stable element includes a pair of cross coupled inverters, and wherein the output of one inverter being coupled to the input of the other inverter through at least one transfer element, and the transfer element being adapted to transfer the output signal of one inverter to the input of the other inverter except during the first period of time.

2. The data pipeline according to claim 1, wherein the dynamic latch stage further comprises a delay element for delaying the second clock signal for the first period of time.

3. The data pipeline according to claim 1, wherein the first stage is a dynamic latch stage comprising an input transfer element adapted to be switched by the first clock signal and a delayed first clock signal, which is delayed by a second period of time being shorter than half a period of the first clock signal, such that the input transfer element allows signal transfer only during the second period of time.

4. The data pipeline according to claim 3, wherein the first bi-stable element comprises two cross-coupled inverters; the output of one inverter being coupled to the input of the respective other inverter through at least one clock controlled transfer element; and the transfer element being adapted to prevent signal transfer during the second period of time.

5. The data pipeline according to claim 4, wherein the first stage further comprises a delay element for delaying the first clock signal for the second period of time.

6. The data pipeline according to claim 2, wherein the first stage is a dynamic latch stage with an input transfer element; and wherein the input transfer element is adapted to be switched by the first clock signal and a third clock signal so as to allow transfer of the input transfer element only during a third period of time which is substantially smaller than half a period of the first clock signal.

7. An apparatus comprising:
    a first latch having an input terminal and an output terminal, and wherein the first latch is clocked by a first clock signal, and wherein the first latch includes a first bi-stable circuit; and a second latch having:
  an input circuit that is coupled to the output terminal of the first latch and that receives a second clock signal, wherein the input circuit generates a pulse on an edge of the second clock signal; and
  a second bi-stable circuit that is coupled to the input circuit, wherein the second bi-stable circuit is clocked by the second clock signal, and wherein the input circuit transmits a signal from the first latch to the second bi-stable circuit in response to the pulse.

8. The apparatus of claim 7, wherein the second bi-stable circuit further comprises:
  a first inverter having an input that is coupled to the input circuit;
  a second inverter having an input that is coupled to an output of the first inverter; and
  a transmission gate that is coupled between an output of the second inverter and the input of the first inverter.

9. The apparatus of claim 8, wherein the input circuit further comprises:
  a transfer element that is coupled to the first latch; and
  a pulse generator that is coupled to the transfer element and that receives the second clock signal so as to generate the pulse.

10. The apparatus of claim 9, wherein the transfer element further comprises:
  a first PMOS transistor that is coupled to the pulse generator at its gate;
  a second PMOS transistor that is coupled to the first latch at its gate and the drain of the first PMOS transistor at its source;
  a first NMOS transistor that is coupled to the first latch at its gate and the source of the second PMOS transistor at its drain; and
  a second NMOS transistor that is coupled to the pulse generator at its gate and the source of the first NMOS transistor at its drain.

11. The apparatus of claim 10, wherein the pulse circuit further comprises:
  a first delay that receive the second clock signal;
  a second delay that receives an inverse of the second clock signal;
  a first logic gate that is coupled to the first delay and the gate of the first PMOS transistor and that receives the second clock signal; and
  a second logic gate that is coupled to the second delay and the gate of the second NMOS transistor and that receives the inverse of the second clock signal.

12. The apparatus of claim 11, wherein the first logic gate further comprises a NAND gate, and wherein the second logic gate further comprises a NOR gate.

13. The apparatus of claim 8, wherein the input circuit further comprises:
  a first delay that receive the second clock signal;
  a second delay that receives an inverse of the second clock signal;
  a first PMOS transistor that is coupled to the first delay at its gate;
  a second PMOS transistor that receives the second clock signal at its gate and that is coupled to the drain of the first PMOS transistor at its source;
  a third PMOS transistor that is coupled to the first latch at its gate and the drain of the second PMOS transistor at its source;
  a first NMOS transistor that is coupled to the first latch at its gate and the source of the third PMOS transistor at its drain;
  a second NMOS transistor that receives the inverse of the second clocks signal at its gate and that is coupled to the source of the first NMOS transistor at its drain; and
  a third NMOS transistor that is coupled to the second delay at its gate and the source of the second NMOS transistor at its drain.

14. The apparatus of claim 9, wherein the first delay further comprises a first set of inverters coupled in series with one another, and wherein the second delay further comprise a second set of inverters coupled in series with one another.

* * * * *